United States Patent
Baker, Jr. et al.

(10) Patent No.: US 9,520,173 B1
(45) Date of Patent: Dec. 13, 2016

(54) MAGNETIC RANDOM ACCESS MEMORY (MRAM) AND METHOD OF OPERATION

(71) Applicant: FREESCALE SEMICONDUCTOR, INC., Austin, TX (US)

(72) Inventors: Frank K. Baker, Jr., Austin, TX (US); Michael A. Sadd, Austin, TX (US); Anirban Roy, Austin, TX (US); Bruce L. Morton, Lakeway, TX (US)

(73) Assignee: FREESCALE SEMICONDUCTOR, INC., Austin, TX (US)

( * ) Notice: Subject to any disclaimer, the term of this patent is extended or adjusted under 35 U.S.C. 154(b) by 0 days.

(21) Appl. No.: 15/057,004

(22) Filed: Feb. 29, 2016

(51) Int. Cl.
*G11C 11/16* (2006.01)
*G11C 13/00* (2006.01)

(52) U.S. Cl.
CPC .............. *G11C 11/165* (2013.01); *G11C 11/16* (2013.01); *G11C 11/1673* (2013.01); *G11C 11/1675* (2013.01); *G11C 13/004* (2013.01); *G11C 13/0069* (2013.01)

(58) Field of Classification Search
CPC .................................................. G11C 11/16
USPC ........................................................ 365/158
See application file for complete search history.

(56) References Cited

U.S. PATENT DOCUMENTS

| | | | |
|---|---|---|---|
| 7,038,959 B2 | 5/2006 | Garni | |
| 7,885,095 B2 * | 2/2011 | Sakimura | G11C 11/16 365/158 |
| 8,009,466 B2 * | 8/2011 | Sakimura | B82Y 10/00 365/158 |
| 8,284,595 B2 * | 10/2012 | Nebashi | G11C 11/15 365/158 |
| 8,363,457 B2 | 1/2013 | Keshtbod | |
| 8,902,644 B2 * | 12/2014 | Sakimura | H01L 27/228 257/421 |
| 2013/0286721 A1 | 10/2013 | Jung et al. | |

OTHER PUBLICATIONS

U.S. Appl. No. 14/924,269, Morton, Bruce et al, "Sense Path Circuitry Suitable for Magnetic Tunnel Junction Memories," filed Oct. 27, 2015.
Klostermann et al, "A Perpendicular Spin Torque Switching based MRAM for the 28 NM Technology Node," IEEE International, 2007, pp. 187-190.
Ohsawa et al, "A 1 Mb Nonvolatile Embedded Memory Using 4T2MTJ Cell With 32 b Fine-Grained Power Gating Scheme," IEEE Journal of Solida-State Circuits, vol. 48, No. 6, Jun. 2013, pp. 1511-1520.
Takemura et al, "A 32-Mb SPRAM With 2T1R Memory Cell, Localized Bi-Directional Write Driver and '1'/'0' Dual-Array Equalized Reference Scheme," IEEE Journal of Solid-State Circuits, vol. 45, No. 4, Apr. 2010, pp. 869-879.
Xu et al, "Design of Spin-Torque Transfer Magnetoresistive RAM and CAM/TCAM with High Sensing and Search Speed," IEEE Transactions on Very Large Scale Integration (VLSI) systems, vol. 18, No. 1, Jan. 2010, pp. 66-74.

* cited by examiner

Primary Examiner — Son Mai

(57) ABSTRACT

A memory device includes a first memory cell having a first transistor, a second transistor, and a resistive storage element. During a read operation, sense current is conducted through the second transistor and the first transistor is used to sense feedback voltage at a first terminal of the resistive storage element. During a write operation, current is conducted through the first and second transistors.

20 Claims, 7 Drawing Sheets

MAGNETIC RANDOM ACCESS MEMORY (MRAM) AND METHOD OF OPERATION

BACKGROUND

Field

This disclosure relates generally to magnetic random access memory (MRAM), and more specifically, to MRAMS utilizing cells having multiple transistors and a magnetic tunnel junction (MTJ) element.

Related Art

One type of emerging memory is a Spin-Transfer-Torque MRAM (STT-MRAM) utilizing a Magnetic Tunnel Junction (MTJ). STT-MRAM memories are being considered to rival FLASH memories and other non-volatile memories. To be commercially practical, however, these memories must have comparable memory density to current memory technologies, be scalable for future generations, operate at low voltages, have low power consumption, and have competitive read/write speeds.

Storing data is accomplished by passing current through an MTJ element, causing it to be either in a low resistive state or a high resistive state. Reading data stored in the memory is accomplished by sensing differences in resistance in the MTJ element between the two states. Typically, the stored state of a memory cell can be determined by comparing the cell state to that of a reference cell. However, the difference in resistance between a high state and a low state can be very small, requiring a sense amplifier with high sensitivity. Therefore, there is a need for a sensing method having increased sensitivity for an improved read operation.

BRIEF DESCRIPTION OF THE DRAWINGS

The present invention is illustrated by way of example and is not limited by the accompanying figures, in which like references indicate similar elements. Elements in the figures are illustrated for simplicity and clarity and have not necessarily been drawn to scale.

DETAILED DESCRIPTION

Due to the relatively small difference in resistance between a high resistive state and a low resistive state in an STT-MRAM, it is desirable to improve sensing of a voltage drop across an MTJ element in a selected memory cell. This voltage drop may be determined by sensing a voltage at each of a first and second terminal of an MTJ element in the selected memory cell. In one embodiment, feedback voltages in the selected memory cell and an adjacent (and unselected) memory cell are used to sense the voltage drop across the MTJ element. These feedback voltages are provided through the use of Kelvin taps and allow the voltages at both terminals of an MTJ element to be accurately determined, independent of any parasitics. A separate path in the selected memory cell is used to provide the sense current. In this manner, an improved read operation may be achieved. Also, the feedback path and sense path may be used in parallel for a write operation, which may allow for reduced memory cell sizing.

Figure 1:
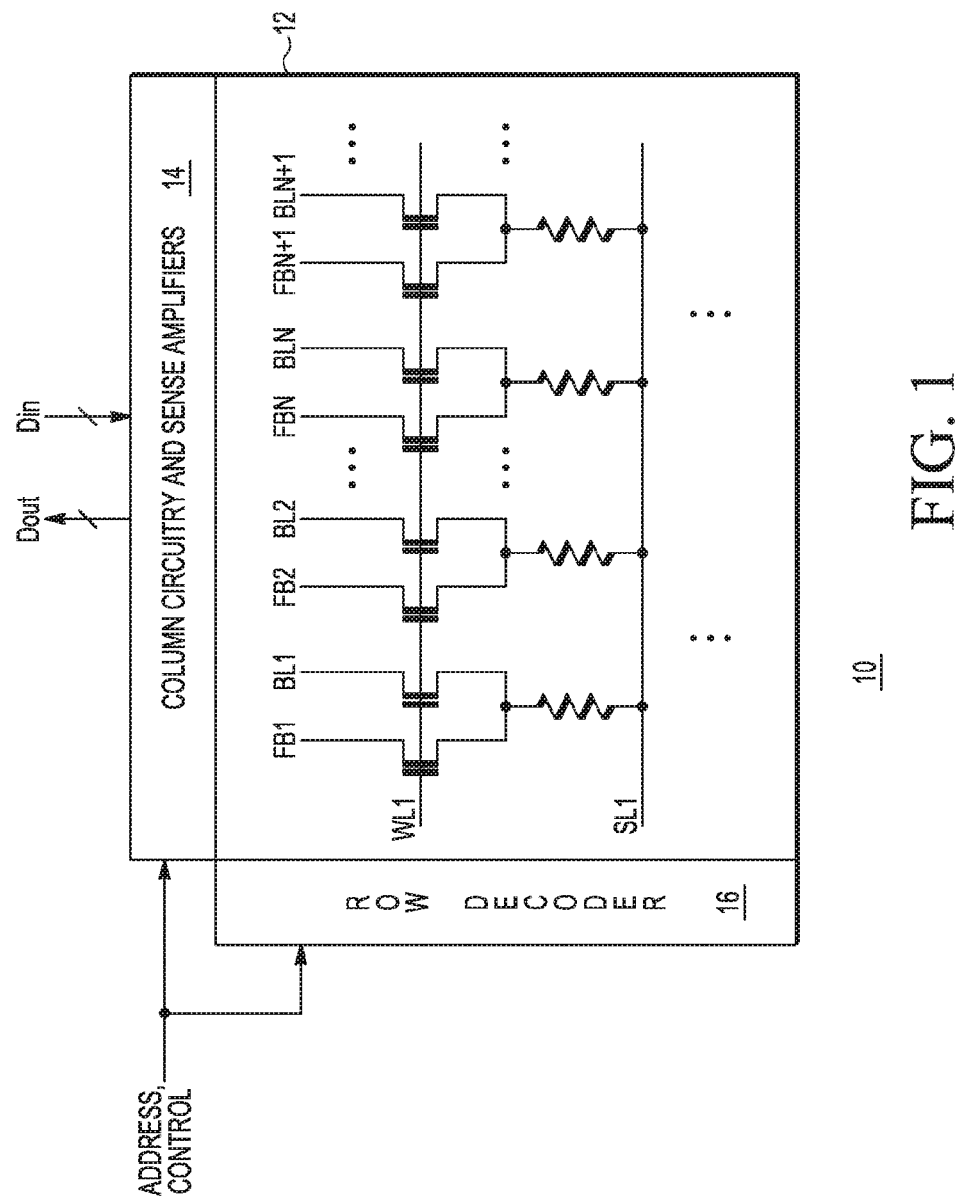
FIG. 1 illustrates, in partial block diagram form and partial schematic form, an STT-MRAM in accordance with one embodiment of the present invention.

FIG. 1 illustrates, in partial block diagram form and partial schematic form, an MRAM 10 in accordance with one embodiment of the present invention. MRAM 10 includes a memory array 12, a row decoder 16, and column circuitry 14. Memory array 12 includes a plurality of bit cells (also referred to as memory cells), each bit cell coupled to a feedback line (FB), a bit line (BL), a word line (WL), and a source line (SL). Each bit cell includes a first transistor coupled to a feedback line and to a first terminal of the MTJ element and a second transistor coupled to a bit line and the first terminal of the MTJ element. The control electrodes of the first and second transistors are coupled to a word line and a second terminal of the MTJ element is coupled to a source line. The MTJ elements may be implemented as variable resistors.

FIG. 1 illustrates N+1 bit lines, N+1 feedback lines, a first word line WL1, and a first source line SL1 of memory array 12. In one embodiment, each of the feedback lines of array 12 (e.g. FB1, FB2, FBN, and FBN+1) and bit lines of array 12 (e.g. BL1, BL2, BLN. BLN+1) is coupled to column circuitry and sense amplifiers 14, and each word line (e.g. WL1) and source line (e.g. SL1) of array 12 is coupled to row decoder 16. Note that array 12 can include any number of bit cells, in which each bit cell includes at least two transistors coupled to a MTJ element. Therefore, array 12 can include any number of bit lines and feedback lines and any number of word lines and source lines. Address and control signals are provided to each of row decoder 16 and column circuitry and sense amplifiers 14 to select one or more bit cells and indicate whether a read access or a write access is being performed. Column circuitry, coupled to the bit lines of array 12, provides the output data, Dout, on for a read access and receives the input data, Din, for a write access.

Figure 2:
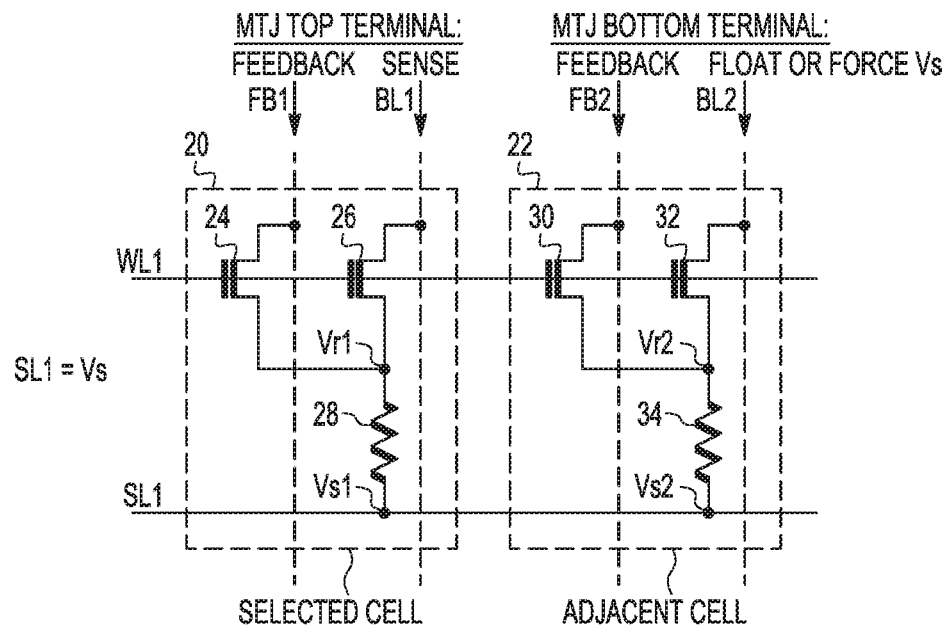
FIG. 2 illustrates in schematic form, a selected bit cell and an adjacent bit cell of the STT-MRAM of FIG. 1 during a read operation, in accordance with one embodiment of the present invention.

FIG. 2 illustrates in schematic form, a selected bit cell 20 and an adjacent bit cell 22 of array 12 during a read operation, in accordance with one embodiment of the present invention. During a read operation of selected bit cell 20, the voltage drop across the MTJ element is sensed to determine the logic state stored in the bit cell. Selected bit cell 20 includes n-type transistors 24 and 26 and an MTJ element 28. A first current electrode of transistor 24 is coupled to a first feedback line, FB1, and a second current electrode of transistor 24 is coupled to a circuit node Vr1. A first current electrode of transistor 26 is coupled to a first bit line, BL1, and a second current electrode of transistor 26 is coupled to circuit node Vr1. Control electrodes of transistors 24 and 26 are coupled to a first word line, WL1. A first terminal of MTJ element 28 is coupled to circuit node Vr1, and a second terminal of MTJ element 28 is coupled to circuit node Vs1. Adjacent bit cell 22 includes n-type transistors 30 and 32 and an MTJ element 34. A first current electrode of transistor 30 is coupled to a second feedback line, FB2, and a second current electrode of transistor 30 is coupled to a circuit node Vr2. A first current electrode of transistor 32 is coupled to a second bit line, BL2, and a second current electrode of transistor 32 is coupled to circuit node Vr2. Control electrodes of transistors 30 and 32 are coupled to WL1. A first terminal of MTJ element 34 is coupled to circuit node Vr2, and a second terminal of MTJ element 34 is coupled to circuit node Vs2. Circuit nodes Vs1 and Vs2 are coupled to a first source line, SL1. In the illustrated embodiment, adjacent bit cell 22 is immediately adjacent selected bit cell 20. Alternatively, it may not be immediately adjacent.

In operation, during a read operation, selected bit cell 20 is selected by the read address. MTJ element 28 being a high resistive state (HRS) corresponds to a first logic state, and MTJ element 28 being in a low resistive state (LRS) corresponds to a second logic state. The voltage drop across MTJ element 28 is sensed to determine the logic state of selected bit cell 20. In order to determine the voltage drop across MTJ element 28, the voltages at nodes Vr1 and Vr2 are sensed. Therefore, during a read operation, transistor 24 is used as a Kelvin tap to measure the voltage at Vr1 (which may be referred to as a first feedback voltage) because FB1 is in a high impedance state. During the read operation, in adjacent bit cell 22, FB2 is in a high impedance state and transistor 30 is used as a Kelvin tap to measure the voltage actually applied to Vr2. Since bit cell 22 is not selected for the read operation, BL2 is also in the high impedance state and no current flows through MTJ element 34. Therefore, the voltage Vs2 is equal to Vr2. Also, since the resistance of the source line, SL1, is very small between adjacent bits, Vs1 is substantially equal to Vs2. By using transistor 30 as a Kelvin tap in adjacent bit cell 22, the voltage at Vs1 (also referred to as a second feedback voltage) can be accurately determined as well. In this manner, with the use of the Kelvin taps, the voltages at both Vr1 and Vs1 can be accurately sensed by the sense amplifier. Transistor 26 in selected bit cell 20 is used to provide a sense current through MTJ 28. The first current electrode of transistor 26 is coupled to a sense voltage during the read operation. Therefore, two branches of selected bit cell 20 are used for a read operation. A first branch including transistor 26 for providing current through MTJ 28, and a second branch, including transistor 24, for sensing the voltage drop over MTJ 28.

In one embodiment, the feedback lines and bit lines of all the unselected bit cells are precharged to Vss prior to enabling WL1. This avoids disturbance of the MTJs in the bit cells. The source line, SL1, is set to Vss. Also, in one embodiment, each N bits along a row share a local source line. These local source lines may run parallel to the bit lines or perpendicular to the bit lines. Alternatively, the bit lines of the unselected bit cells are left floating.

With the configuration illustrated in FIG. 2, the sense amplifiers in column circuitry and sense amplifiers 14 use transistor 24 to sense a feedback voltage at node Vr1 (at the first terminal of MTJ element 28) and use transistor 30 in adjacent bit cell 22 to sense a feedback voltage at node Vs1 (at the second terminal of MTJ element 18). For example, each of nodes Vr1 and Vr2 may be coupled to inputs of the sense amplifiers in column circuitry and sense amplifiers 14 so that the sense amplifiers can sense the voltages at Vr1 and Vr2 (in which Vs1=Vr2). In this manner, at least one adjacent bit cell is used to provide a feedback voltage for the selected bit cell. Similarly, bit cell 20, when not selected, may provide a feedback voltage for another adjacent bit cell.

Figure 3:
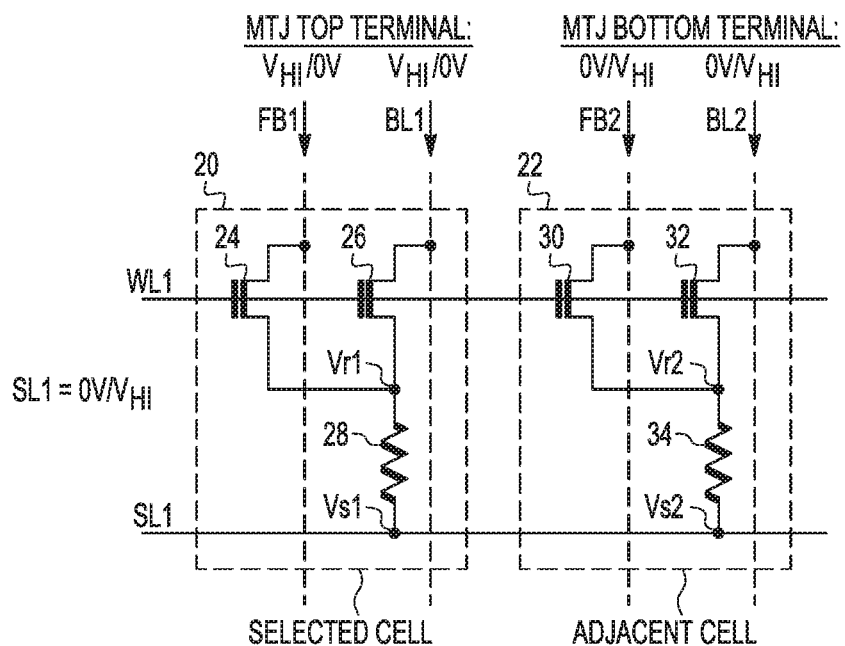
FIG. 3 illustrates in schematic form, a selected bit cell and an adjacent bit cell of the STT-MRAM of FIG. 1 during a write operation, in accordance with one embodiment of the present invention.

FIG. 3 illustrates in schematic form, selected bit cell 20 and adjacent bit cell 22 of array 12 during a write operation, in accordance with one embodiment of the present invention. During a write operation of selected bit cell 20, current is provided through MTJ element 28 in a first direction to write a first logic state and in a second direction, opposite the first direction, to write a second logic state. The first logic state (e.g., 0) may correspond to a low resistance state (LRS) and the second logic state (e.g., 1) to a high resistance state (HRS), or vice versa.

In the case where the first logic state is a 0 and corresponds to a LRS, and the second logic state is a 1 and corresponds to a HRS, a 0 may be written to selected bit cell 20 by setting FB1 and BL1 to a high voltage (Vhi), setting SL1 to 0V, and applying a select voltage to WL1. In this manner, current is provided down through MTJ element 28, placing MTJ element 28 in a LRS. While writing a 0, FB2 and BL2 in adjacent bit cell 22 can be set to 0V. This keeps Vr2, and thus Vs2 and Vs1, at 0V to aid in programming selected bit cell 20. A 1 may be written to selected bit cell 20 by setting FB1 and BL1 to 0V, and setting SL1 to Vhi. In this manner, a current is provided up through MTJ element 28, placing MTJ element 28 in a HRS. While writing a 1, FB2 and BL2 in adjacent bit cell 22 can be set to Vhi to aid in programming selected bit cell 20. The voltages applied to the first current electrodes of transistors 24 and 26 for the write operation (e.g., Vhi or 0V) may be referred to as a write voltage. In one embodiment, note that the feedback lines, bit lines, and source line are biased prior to enabling the word line.

For the write operation, in selected bit cell 20, both transistors 24 and 26 are enabled in parallel to provide a current though MTJ element 28. Therefore, it is possible to set transistors 24 and 26 to a smaller size since each transistor only has to provide, at most, half of the write current. This allows for a savings in area for the bit cells.

Figure 4:
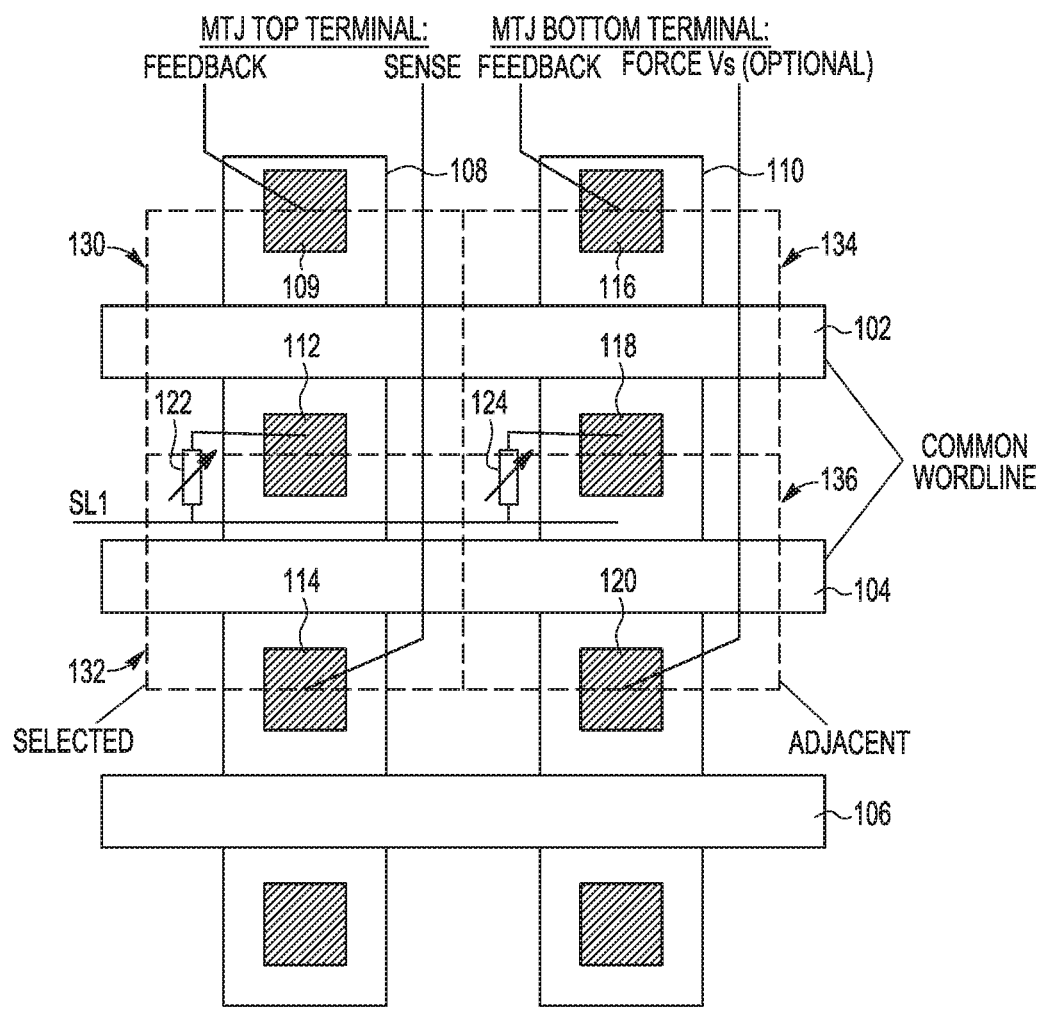
FIGS. 4 and 5 illustrate, in layout form, portions of an STT-MRAM array in accordance with embodiments of the present invention.
Figure 5:
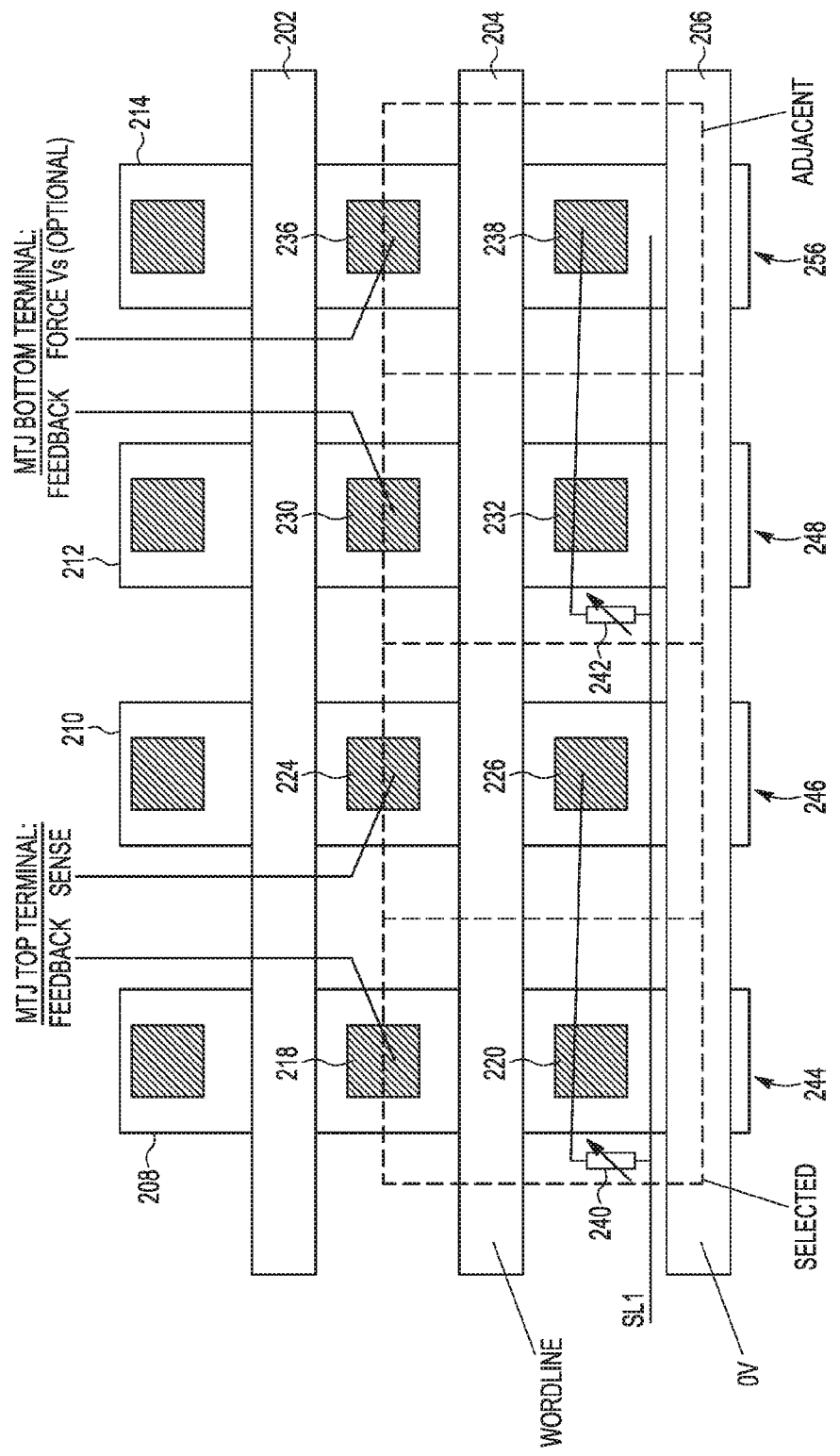

FIGS. 4 and 5 illustrate, in layout form, portions of an MRAM array in accordance with embodiments of the present invention. In array 100 of FIG. 4, transistors 130 and 132 correspond to a selected bit cell and transistors 134 and 136 correspond to an adjacent unselected bit cell. In the selected bit cell, MTJ element 122 is coupled to transistors 130 and 132, in which transistors 130 and 132 share diffusion region 108. Transistor 130 corresponds to the transistor in the feedback path, such as transistor 24, and transistor 132 corresponds to the transistor in the sense path, such as transistor 26. Contact 109 provides a contact to a first current electrode of transistor 130 which corresponds to a feedback line, contact 114 provides a contact to a first current electrode of transistor 132 which corresponds to a bit line, and contact 112 provides a contact to the second current electrodes of transistors 130 and 132 and a first terminal of MTJ element 122. In the adjacent unselected bit cell, MTJ element 124 is coupled to transistors 134 and 136, in which transistors 134 and 136 share diffusion regions 110. Transistor 134 corresponds to the transistor in the feedback path, such as transistor 30, and transistor 136 corresponds to the transistor in the sense path, such as transistor 32. Contact 116 provides a contact to a first current electrode of transistor 134 which corresponds to a feedback line, contact 120 provides a contact to a first current electrode of transistor 136 which corresponds to a bit line, and contact 118 provides a contact to the second current electrodes of transistors 134 and 136 and a first terminal of MTJ 124. Second terminals of MTJ elements 122 and 124 are coupled to SL1.

Note that gate electrodes 102 and 104 correspond to a common word line, such as WL1. Therefore, FIG. 4 illustrates a vertical configuration for laying out the bit cells of array 12.

FIG. 5 illustrates a horizontal configuration for laying out the bit cells of array 12. In array 200 of FIG. 5, transistors 244 and 246 correspond to a selected bit cell and transistors 248 and 250 correspond to an adjacent unselected bit cell. In the selected bitcell, MTJ element 240 is coupled to transistors 244 and 246, in which transistor 244 uses active region 208 and transistor 246 uses active region 210. Transistor 244 corresponds to the transistor in the feedback path, such as transistor 24, and transistor 246 corresponds to the transistor in the sense path, such as transistor 26. Contact 218 provides a contact to a first current electrode of transistor 244 which corresponds to a feedback line, contact 220 provides a contact to a second current electrode of transistor 244 and a first terminal of MTJ element 240, contact 224 provides a contact to a first current electrode of transistor 246, and contact 226 provides a contact to a second electrode of transistor 246 and the first terminal of MTJ element 240. In the adjacent unselected bit cell, MTJ element 242 is coupled to transistors 248 and 250, in which transistor 248 uses active region 212 and transistor 250 uses active region 214. Transistor 248 corresponds to the transistor in the feedback path, such as transistor 30, and transistor 250 corresponds to the transistor in the sense path, such as transistor 32. Contact 230 provides a contact to a first current electrode of transistor 248 which corresponds to a feedback line, contact 232 provides a contact to a second current electrode of transistor 248 and a first terminal of MTJ element 242, contact 236 provides a contact to a first current electrode of transistor 250, and contact 238 provides a contact to a second electrode of transistor 250 and the first terminal of MTJ element 242. Second terminals of MTJ elements 240 and 242 are coupled to SL1. Gate electrode 204 corresponds to a word line, such as WL1.

Figure 6:
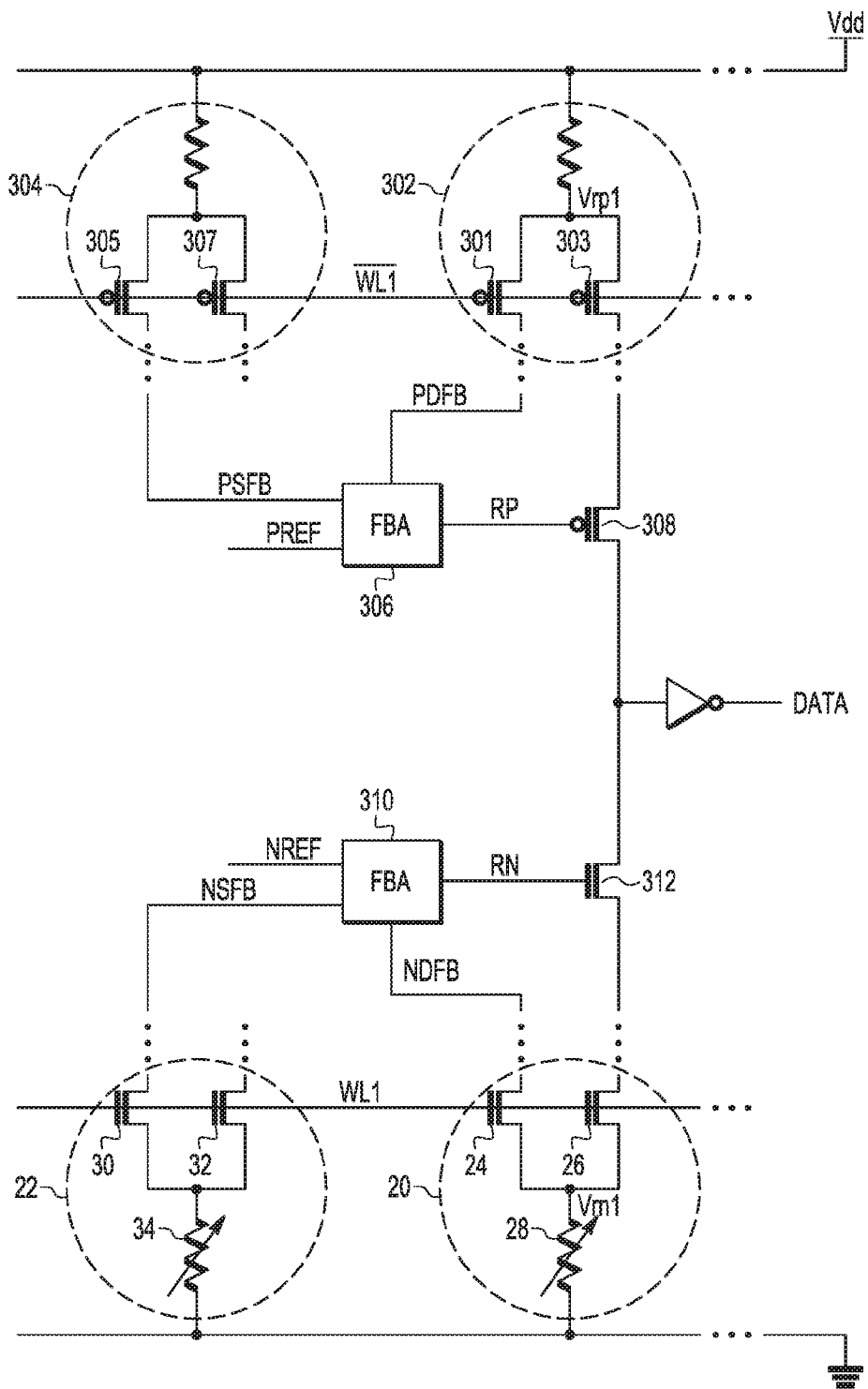
FIG. 6 illustrates, in partial block diagram and partial schematic form, a portion of a sense amplifier in accordance with one embodiment of the present invention.

FIG. 6 illustrates, in partial block diagram and partial schematic form, a portion of a sense amplifier 300 coupled to bit cells of array 12, such as bit cells 22 and 20, and to references cells 302 and 304, in which sense amplifier 300 may be within column circuitry and sense amplifiers 14. Reference cell 304 has the same schematic form as bit cell 20, and reference cell 302 has the same schematic form as bit cell 22. The variable resistors, which correspond to MTJ elements 28 and 34, are shown in bit cells 20 and 22. MTJ elements 28 and 34 are coupled to Vss (a first supply voltage) through a potentially resistive path. Resistors in reference cells 304 and 302 may be constructed from MTJ elements or other resistors as needed to provide an appropriate reference resistance. Sense amplifier 300 also includes feedback amplifiers (FBAs) 306 and 310. Reference cell 304 includes a resistor having a first terminal coupled to Vdd (a second supply voltage) and two p-type transistors 305, 307 in parallel having first current electrodes coupled to a second terminal of the resistor, in which a second current electrode of transistor 305 is coupled to provide a P-side source line feedback signal (PSFB) to FBA 306. Reference cell 302 includes a resistor having a first terminal coupled to Vdd and two p-type transistors 301, 303 in parallel having first current electrodes coupled to a second terminal of the resistor, in which a second current electrode of transistor 301 is coupled to provide a P-side data feedback signal (PDFB) to FBA 306. The control electrodes of the two transistors 303, 305, 301, and 307 are coupled to an inverse word line (WL1 bar). The first terminals of the resistors of reference cells 302 and 304 are coupled to Vdd through a potentially resistive path.

Sense amplifier 300 includes a p-type transistor 308 having a first current electrode coupled to a second current electrode of transistor 303. FBA 306 is coupled to provide a P-side regulation bias (RP) to a control electrode of transistor 308. FBA 306 also receives a P-side data feedback signal (PDFB) from the second current electrode of transistor 301. Sense amplifier 300 also includes an n-type transistor 312 having a first current electrode coupled to a second current electrode of transistor 308 and a second current electrode coupled to the first current electrode of transistor 26. FBA 310 is coupled to provide an N-side regulation bias (RN) to a control electrode of transistor 312. FBA 310 receives an N-side source line feedback signal (NSFB) from the first current electrode of transistor 30 and an N-side data feedback signal (NDFB) from the first current electrode of transistor 24. FBA 306 receives a P reference signal (PREF) and FBA 310 receives an N reference signal (NREF). The second current electrode of transistor 308 and the first current electrode of transistor 312 provides an inverted data output. Transistors 308 and 312 may be referred to as regulation transistors. During a read, FBA 310, transistor 312, and bit cell 20 operate in a regulated feedback loop such that RN is adjusted to regulate the bias Vrn1 at the first terminal of MTJ element 28 to a bias (NREF+NSFB). Likewise, during a read, FBA 306, transistor 308, and reference cell 302 operate in a regulated feedback loop such that RP is adjusted to regulate the bias Vrp1 at the first current electrode of transistor 303 to a bias (PREF+PSFB−Vdd).

Figure 7:
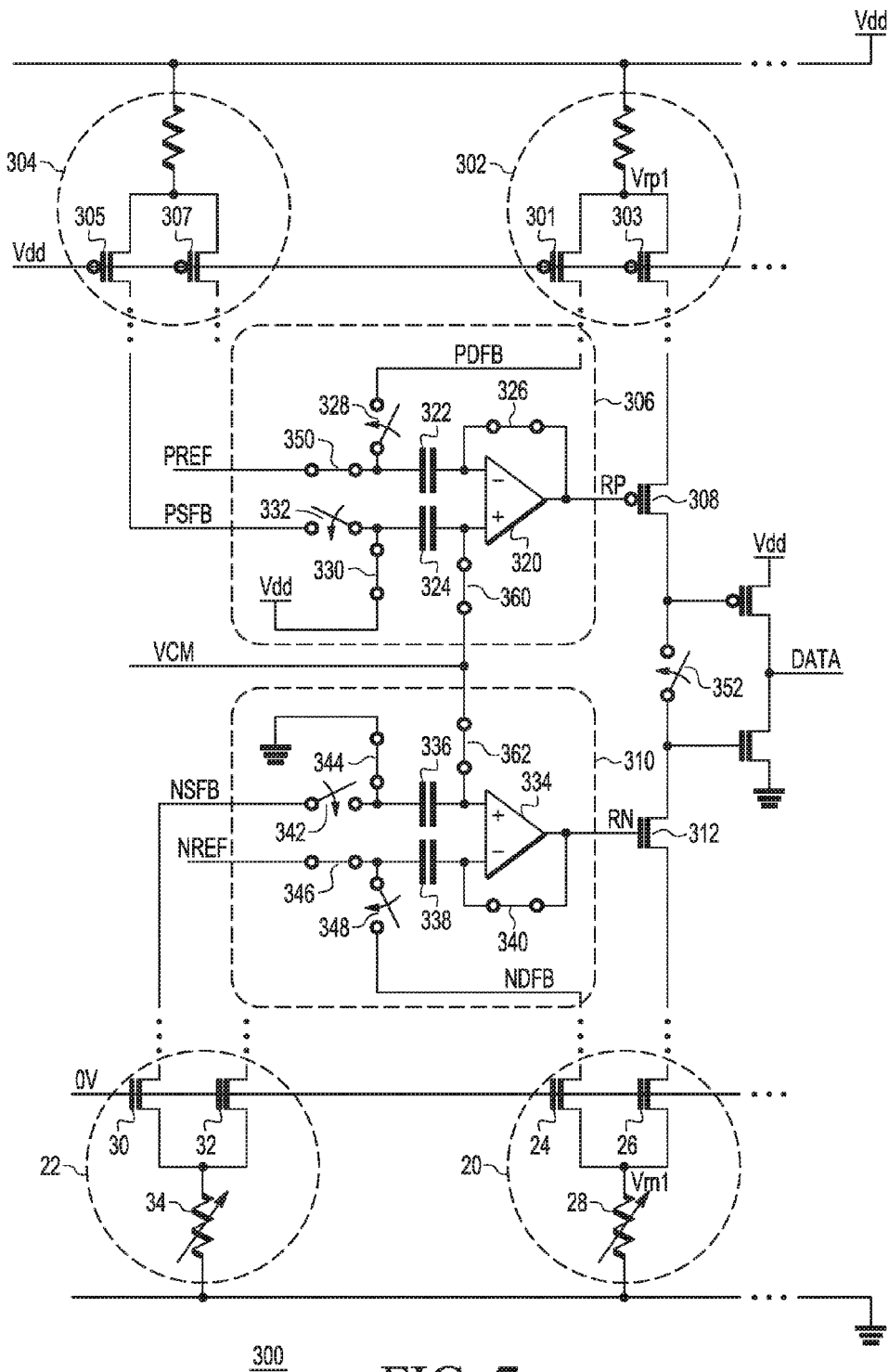
FIG. 7 illustrates, in schematic form, the sense amplifier of FIG. 6 during a calibrate phase in accordance with one embodiment of the present invention.

Operation of sense amplifier 300 will be described in further detail in reference to FIGS. 7 and 8. FBA 306 includes switches 328, 330, 332, 350, 360, and 326, capacitors 322 and 324, and differential amplifier 320. FBA 310 includes switches 342, 346, 344, 348, 362, and 340, capacitors 338 and 336, and differential amplifier 334. A first terminal of switch 350 is coupled to a voltage supply or reference PREF, which is set to approximately Vdd-NREF. A second terminal of switch 350 is coupled to a first terminal of switch 328 and a first terminal of capacitor 322. A second terminal of switch 328 is coupled to the second current electrode of transistor 301. A second terminal of capacitor 322 is coupled to an inverting input of amplifier 320. A first terminal of switch 330 is coupled to Vdd, and a second terminal of switch 330 is coupled to a first terminal of switch 332 and a first terminal of capacitor 324. A second terminal of switch 332 is coupled to the first current electrode of transistor 305. A second terminal of capacitor 324 is coupled to a noninverting input of amplifier 320. The inverting input of amplifier 320 is coupled to a first terminal of switch 326. The noninverting input of amplifier 320 is coupled to a first terminal of switch 360, and the second terminal of switch 360 is coupled to a supply voltage or reference VCM which is the common mode voltage for differential amplifiers 320 and 334. An output of amplifier 320 is coupled to a second terminal of switch 326 and the control electrode of transistor 308.

In FBA 310, a first terminal of switch 344 is coupled to a voltage supply, such as Vss. A second terminal of switch 344 is coupled to a first terminal of switch 342 and a first terminal of capacitor 336. A second terminal of switch 342 is coupled to the first current electrode of transistor 30. A second terminal of capacitor 336 is coupled to a noninverting input of differential amplifier 334. A first terminal of switch 346 is coupled to a voltage supply or reference NREF, which may be, for example, in the range of 50-100 mV, and a second terminal of switch 346 is coupled to a first terminal of switch 348 and a first terminal of capacitor 338. A second terminal of switch 348 is coupled to the first current electrode of transistor 24. A second terminal of capacitor 338 is coupled to an inverting input of differential amplifier 334. The inverting input of differential amplifier 334 is coupled to a first terminal of switch 340. The noninverting input of differential amplifier 334 is coupled to a first terminal of switch 362, and the second terminal of switch 362 is coupled to the supply voltage or reference VCM. An output of amplifier 334 is coupled to a second terminal of switch 340 and the control electrode of transistor 312.

Sense amplifier 300 operates in two phases: a calibrate phase and sense phase. FIG. 7 illustrates sense amplifier 300 during the calibration phase in which switches 350, 330, 326, 340, 344, 360, 362, and 346 are closed. Switches 328, 332, 342, and 348 are open. Also, switch 352 between transistors 308 and 312 is open. During the calibrate phase, PREF, which may for example be Vdd-NREF, is applied to the first terminal of capacitor 322, in which the second terminal of capacitor 322 is connected to the inverting input and output of differential amplifier 320 joined through switch 326. During the calibrate phase, Vdd is applied to the first terminal of capacitor 324. Therefore, capacitor 322 is precharged to a first reference voltage during the calibrate phase, and capacitor 324 is precharged to Vdd. Differential amplifier 320 is placed at its unity gain point. FBA 306 is decoupled from transistors 301 and 305. NREF is applied to the first terminal of capacitor 338, and the second terminal of capacitor 338 is connected to the inverting input and output of differential amplifier 334 joined through switch 340. Vss is applied to the first terminal of capacitor 336. Therefore, capacitor 338 is precharged to a second reference voltage during the calibrate phase, and capacitor 336 is precharged to Vss. Differential amplifier 334 is placed at its unit gain point. FBA 310 is decoupled from transistors 30 and 24. Transistors 308 and 312 are turned on, and transistors 305, 307, 301, 303, 30, 32, 24, and 26 remain off.

Figure 8:
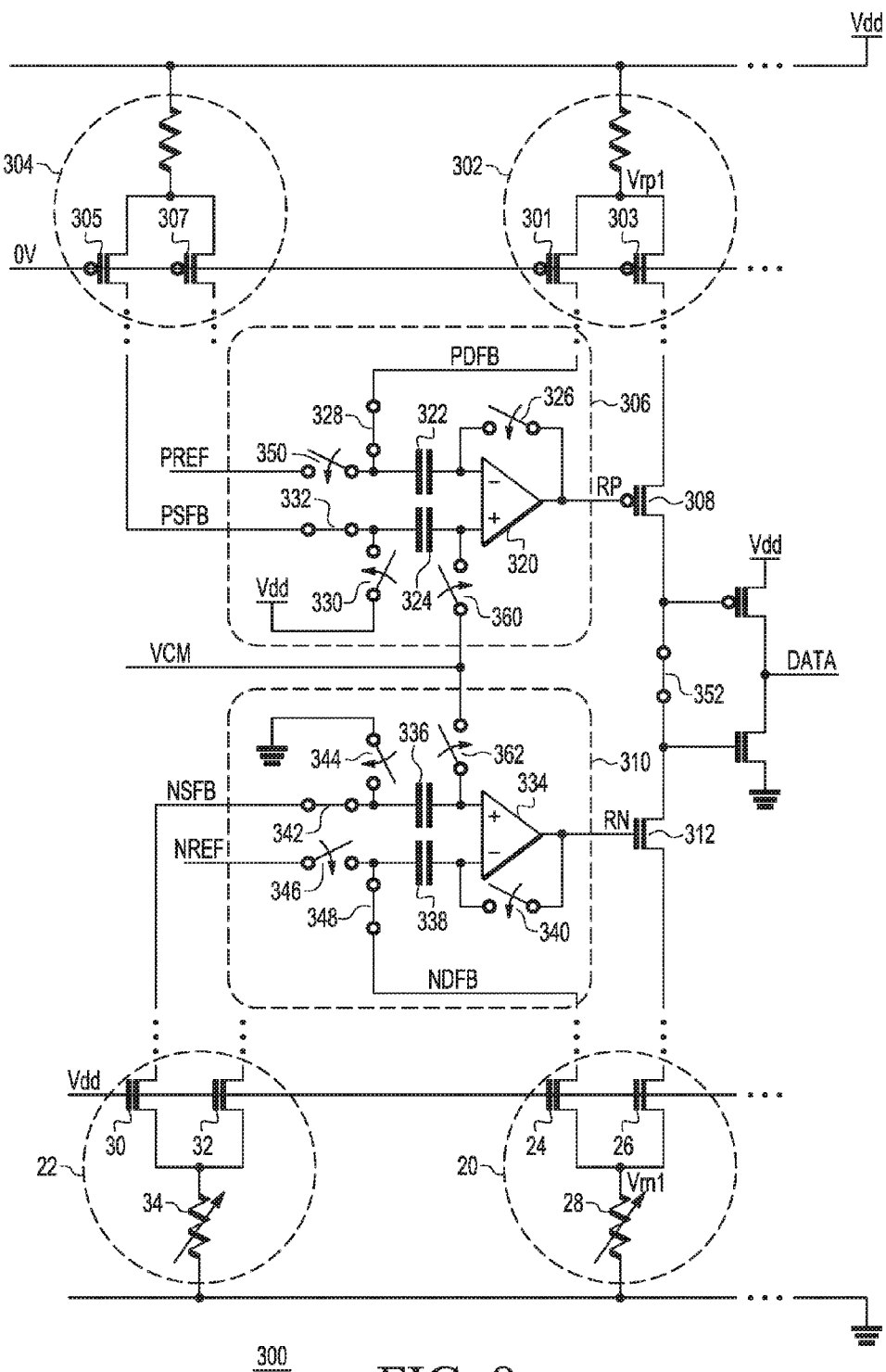
FIG. 8 illustrates, in schematic form, the sense amplifier of FIG. 6 during a sense phase in accordance with one embodiment of the present invention

For the sense phase, as shown in FIG. 8, after the calibrate phase, switches 328, 332, 352, 342, and 348 are closed, and switches 350, 330, 326, 340, 344, 360, 362, and 346 are now open. In this manner, the first terminal of capacitor 336 is coupled to the first current electrode of transistor 30, and the first terminal of capacitor 338 is coupled to the first current electrode of transistor 24, which is the feedback voltage at the first terminal of MTJ element 28. Capacitor 338 provides a high impedance path for the feedback voltage at the first terminal of MTJ element 28. Therefore, transistor 24 provides a Kelvin tap for this feedback voltage. Capacitor 336 provides a high impedance path for the feedback voltage at the second current electrode of transistor 30 (which corresponds to the feedback voltage at the first terminal of MTJ element 34). Also, during the sense phase, switch 340 is open and differential amplifier 334 is coupled to the second terminals of capacitors 338 and 336 at its inverting and noninverting inputs, respectively. During the sense phase, the first terminal of capacitor 322 is coupled to the second current electrode of transistor 301 and the first terminal of capacitor 324 is coupled to the second current electrode of transistor 305 in adjacent cell 304. Capacitor 322 provides a high impedance path for the feedback voltage at the first current electrode of transistor 301 (which corresponds to the feedback voltage at the second terminal of the resistor in cell 302). Capacitor 324 provides a high impedance path for the feedback voltage at the first current electrode of transistor 305 (which corresponds to the feedback voltage at the second terminal of the resistor in cell 304). Switch 326 is open, and the inverting and noninverting inputs of differential amplifier 320 are coupled to the second terminals of capacitors 322 and 324, respectively.

During the sense phase, the feedback voltage at the first terminal of MTJ element 28 is sensed by a first input of sense amplifier 300 at the first terminal of capacitor 338, and the feedback voltage at the second terminal of MTJ element 28 (which is substantially equal to the voltage at the first current electrode of transistor 30, as discussed above) is sensed by a second input of sense amplifier 300 at the first terminal of capacitor 336. During the sense phase, differential amplifier 334 acts to adjust RN due to the difference between the changes in bias on the first terminal of capacitors 336 and 338, and their respective calibrate bias. Therefore, the differential amplifier will adjust RN to react to (NDFB−NREF)+(NSFB) in a way to maintain the voltage on the first terminal of MTJ element 28 at NREF+NSFB. Therefore, the sense amplifier attempts to maintain the voltage difference between the first and second terminals of MTJ elements 28 at a value approximately equal to NREF by adjusting the current through transistors 312 and 26. Likewise, differential amplifier 320 acts to adjust RP due to the difference between the changes in bias on the first terminal of capacitors 322 and 324, and their respective calibrate bias. Therefore, amplifier 320 will adjust RP to react to (PDFB−PREF)+(PSFB−Vdd) in a way to maintain the voltage on the first terminal of the resistor in cell 302 at PREF+PSFB−Vdd. Therefore, the sense amplifier attempts to maintain the voltage difference between the first and second terminals of the MTJ element in cell 302 at a value approximately equal to NREF if PREF is set to Vdd−NREF by adjusting the current through transistors 308 and 303. The feedback voltages at the first terminals of capacitors 336, 338, 324, and 322 adjust the sense current through transistors 26 and 303 by affecting the voltage on the controls electrodes of transistors 308 and 312. In some embodiments, it may not be necessary to adjust both RP and RN for changes in NSFB or PSFB. For example, if the bias at the first terminal of the MTJ elements in cell 302 is always substantially equal to Vdd during sensing, then accurate sensing may be obtained without coupling PSFB to differential amplifier 320 during sensing, but instead only coupling NSFB to differential amplifier 334 during sensing.

The node between transistors 308 and 312, such as at closed switch 352, provides the output of memory cell 20. As illustrated in FIG. 6, the output can be provided via an inverter as DATA. Depending on whether MTJ element 28 is in a HRS or LRS, the output of memory cell 20 will be one logic state or another. Transistors 308 and 312 operate to perform a comparison based on RP at the control electrode of transistor 308 and RN at the control electrode of transistor 312.

By now it should be appreciated how feedback voltages in a selected memory cell and an adjacent unselected memory cell can provide for improved accuracy when sensing the voltage across over a resistive storage element, such as an MTJ element. Through the use of Kelvin taps to provide high impedances, the voltages at the first and second terminals of an MTJ element can be more accurately determined, independent of any parasitics. Note that a separate sense path within a selected memory cell is used to provide the sense current through the MTJ element. Through the use of the feedback path for providing the feedback voltages and the sense path, an improved read operation may be achieved.

Also, the feedback path and sense path may be used in parallel for a write operation, which may allow for reduced memory cell sizing.

Although the discussion herein is focused on STT-MRAM memories utilizing MTJ elements, it should be appreciated that the same cell operation, cell layout, and sensing method can be applied to any resistive-type memory cells in which additional margin during read operation is beneficial. This can include resistive RAMs (RRAMs), phase-change memories (PCMs) and the like.

Because the apparatus implementing the present invention is, for the most part, composed of electronic components and circuits known to those skilled in the art, circuit details will not be explained in any greater extent than that considered necessary as illustrated above, for the understanding and appreciation of the underlying concepts of the present invention and in order not to obfuscate or distract from the teachings of the present invention.

Although the invention has been described with respect to specific conductivity types or polarity of potentials, skilled artisans appreciated that conductivity types and polarities of potentials may be reversed.

Moreover, the terms "front," "back," "top," "bottom," "over," "under" and the like in the description and in the claims, if any, are used for descriptive purposes and not necessarily for describing permanent relative positions. It is understood that the terms so used are interchangeable under appropriate circumstances such that the embodiments of the invention described herein are, for example, capable of operation in other orientations than those illustrated or otherwise described herein.

Some of the above embodiments, as applicable, may be implemented using a variety of different information processing systems. For example, although FIG. 1 and the discussion thereof describe an exemplary information processing architecture, this exemplary architecture is presented merely to provide a useful reference in discussing various aspects of the invention. Of course, the description of the architecture has been simplified for purposes of discussion, and it is just one of many different types of appropriate architectures that may be used in accordance with the invention. Those skilled in the art will recognize that the boundaries between logic blocks are merely illustrative and that alternative embodiments may merge logic blocks or circuit elements or impose an alternate decomposition of functionality upon various logic blocks or circuit elements. Thus, it is to be understood that the architectures depicted herein are merely exemplary, and that in fact many other architectures can be implemented which achieve the same functionality.

Also for example, in one embodiment, the illustrated elements of system 10 are circuitry located on a single integrated circuit or within a same device. Alternatively, system 10 may include any number of separate integrated circuits or separate devices interconnected with each other.

Furthermore, those skilled in the art will recognize that boundaries between the functionality of the above described operations merely illustrative. The functionality of multiple operations may be combined into a single operation, and/or the functionality of a single operation may be distributed in additional operations. Moreover, alternative embodiments may include multiple instances of a particular operation, and the order of operations may be altered in various other embodiments.

Although the invention is described herein with reference to specific embodiments, various modifications and changes can be made without departing from the scope of the present invention as set forth in the claims below. For example, the source lines may be routed parallel or perpendicular to the bit lines according to different configurations. Accordingly, the specification and figures are to be regarded in an illustrative rather than a restrictive sense, and all such modifications are intended to be included within the scope of the present invention. Any benefits, advantages, or solutions to problems that are described herein with regard to specific embodiments are not intended to be construed as a critical, required, or essential feature or element of any or all the claims.

The term "coupled," as used herein, is not intended to be limited to a direct coupling or a mechanical coupling.

Furthermore, the terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an." The same holds true for the use of definite articles.

Unless stated otherwise, terms such as "first" and "second" are used to arbitrarily distinguish between the elements such terms describe. Thus, these terms are not necessarily intended to indicate temporal or other prioritization of such elements.

The following are various embodiments of the present invention.

In one embodiment, a memory device includes a first memory cell including a first transistor, a second transistor, and a resistive storage element, wherein during a read operation, sense current is conducted through the second transistor and the first transistor is used to sense feedback voltage at a first terminal of the resistive storage element, and during a write operation, current is conducted through the first and second transistors. In one aspect, the memory device further includes a sense amplifier; a second memory cell including a first transistor, a second transistor, and a resistive storage element; a word line coupled to control gates of the first and second transistors of the first and second memory cells; and a source line coupled to a second terminal of the resistive storage elements in the first and second memory cells, wherein the first transistor of the second memory cell is used by the sense amplifier to sense a feedback voltage at the second terminal of the resistive storage element in the first memory cell during the read operation. In a further aspect, the voltage at the first current electrode of the first transistor of the second memory cell is approximately the same as voltage at the second terminal of the resistive storage element of the first memory cell during the read operation. In another further aspect, a first current electrode of the first transistor of the first memory cell is coupled to provide feedback for a third memory cell during a read operation. In another aspect of the above embodiment, the first memory cell is coupled directly adjacent to the second memory cell. In a further aspect, a first current electrode of the second transistor of the second memory cell is coupled to float or to a source voltage during the read operation; a second current electrode of the first and second transistors of the second memory cell is coupled to the first terminal of the resistive storage element of the second memory cell. In another aspect, a first current electrode of the second transistor of the first memory cell is coupled to a sense voltage during the read operation; a second current electrode of the first and second transistors of the first memory cell is coupled to the first terminal of the resistive storage element of the first memory cell. In another aspect, the resistive storage elements of the first and second memory cells comprise a magnetic tunnel junction. In another aspect, the feedback voltage at the second terminal of the resistive storage element in the first memory cell is used to adjust a current provided to the first memory cell during the read operation. In another aspect, the memory device further includes a first capacitor in the sense amplifier, the capacitor is coupled to the feedback voltage at the first terminal of the resistive storage element of the first memory cell, wherein the first capacitor provides a high impedance path for the feedback voltage at the first terminal of the resistive storage element of the first memory cell. In a further aspect, the memory device further includes an amplifier in the sense amplifier, wherein the first capacitor includes a first terminal coupled to a first input to the amplifier and a second terminal coupled to the feedback voltage during the read operation. In another further aspect, the memory device further includes a second capacitor in the sense amplifier, the second capacitor includes a first terminal coupled to a second input of the amplifier and a second terminal coupled to a feedback voltage at the second terminal of the resistive storage element in the first memory cell during the read operation.

In another embodiment, a method of operating a memory device includes providing a sense current through a first transistor of a first memory cell; sensing a first feedback voltage at a first current electrode of a second transistor in the first memory cell, wherein the first feedback voltage is at a first terminal of a resistive storage element and the first current electrode of the second transistor of the first memory cell is coupled to an input of a sense amplifier; sensing a second feedback voltage at a first current electrode of a first transistor of a second memory cell, wherein the second feedback voltage is at a second terminal of the resistive storage element and the first current electrode of the first transistor of the second memory cell is coupled to another input of the sense amplifier; adjusting the sense current through the first memory cell based on the first and second feedback voltages. In one aspect of the another embodiment, the sense current is adjusted during a read operation. In another aspect, the method further includes applying a source line voltage to the second terminal of the resistive storage element of the first memory cell and to a second terminal of a resistive storage element of the second memory cell. In another aspect, the method further includes during a write operation: applying a write voltage to the first current electrodes of the first and second transistors in the first memory cell, and enabling a word line coupled to the first memory cell. In another aspect, the sense current is adjusted by precharging a first capacitor to a reference voltage during a calibration phase; and coupling a first terminal of the first capacitor to the first current electrode of the second transistor in the first memory cell during a sensing phase, wherein a second terminal of the first capacitor is coupled to a first input of an amplifier. In a further aspect, the method further includes precharging a second capacitor to a supply voltage during a calibration phase; and coupling a first terminal of the second capacitor to the first current electrode of the first transistor in the second memory cell during a sensing phase, wherein a second terminal of the second capacitor is coupled to a second input of the amplifier. In another aspect, the first resistive storage element is a non-volatile programmable resistor.

In another embodiment, an integrated circuit device includes a memory device including: a first memory cell having a first transistor, a second transistor, and a non-volatile programmable resistor; a bit line coupled to a first current electrode of the first transistor during a read operation; a sense amplifier including an input coupled to a first current electrode of the second transistor during the read operation; a write voltage coupled to the first current electrode of the first and second transistors during a write operation; a second current electrode of the first and second transistors coupled to a first terminal of the non-volatile programmable resistor; a source line coupled to a second terminal of the non-volatile programmable resistor; a word line coupled to a control electrode of the first and second transistors.

What is claimed is:

1. A memory device comprising:
   a first memory cell including a first transistor, a second transistor, and a resistive storage element, wherein
      during a read operation, sense current is conducted through the second transistor and the first transistor is used to sense feedback voltage at a first terminal of the resistive storage element, and
      during a write operation, current is conducted through the first and second transistors.

2. The memory device of claim 1 further comprising:
   a sense amplifier;
   a second memory cell including a first transistor, a second transistor, and a resistive storage element;
   a word line coupled to control gates of the first and second transistors of the first and second memory cells; and
   a source line coupled to a second terminal of the resistive storage elements in the first and second memory cells,
   wherein the first transistor of the second memory cell is used by the sense amplifier to sense a feedback voltage at the second terminal of the resistive storage element in the first memory cell during the read operation.

3. The memory device of claim 2 wherein:
   the voltage at the first current electrode of the first transistor of the second memory cell is approximately the same as voltage at the second terminal of the resistive storage element of the first memory cell during the read operation.

4. The memory device of claim 2 wherein:
   a first current electrode of the first transistor of the first memory cell is coupled to provide feedback for a third memory cell during a read operation.

5. The memory device of claim 1 wherein:
   the first memory cell is coupled directly adjacent to the second memory cell.

6. The memory device of claim 4 wherein:
   a first current electrode of the second transistor of the second memory cell is coupled to float or to a source voltage during the read operation;
   a second current electrode of the first and second transistors of the second memory cell is coupled to the first terminal of the resistive storage element of the second memory cell.

7. The memory device of claim 2 wherein:
   a first current electrode of the second transistor of the first memory cell is coupled to a sense voltage during the read operation;
   a second current electrode of the first and second transistors of the first memory cell is coupled to the first terminal of the resistive storage element of the first memory cell.

8. The memory device of claim 2 wherein:
   the resistive storage elements of the first and second memory cells comprise a magnetic tunnel junction.

9. The memory device of claim 2 wherein:
the feedback voltage at the second terminal of the resistive storage element in the first memory cell is used to adjust a current provided to the first memory cell during the read operation.

10. The memory device of claim 1 further comprising:
a first capacitor in the sense amplifier, the capacitor is coupled to the feedback voltage at the first terminal of the resistive storage element of the first memory cell, wherein the first capacitor provides a high impedance path for the feedback voltage at the first terminal of the resistive storage element of the first memory cell.

11. The memory device of claim 10 further comprising:
an amplifier in the sense amplifier, wherein the first capacitor includes a first terminal coupled to a first input to the amplifier and a second terminal coupled to the feedback voltage during the read operation.

12. The memory device of claim 11 further comprising:
a second capacitor in the sense amplifier, the second capacitor includes a first terminal coupled to a second input of the amplifier and a second terminal coupled to a feedback voltage at the second terminal of the resistive storage element in the first memory cell during the read operation.

13. A method of operating a memory device comprising:
providing a sense current through a first transistor of a first memory cell;
sensing a first feedback voltage at a first current electrode of a second transistor in the first memory cell, wherein the first feedback voltage is at a first terminal of a resistive storage element and the first current electrode of the second transistor of the first memory cell is coupled to an input of a sense amplifier;
sensing a second feedback voltage at a first current electrode of a first transistor of a second memory cell, wherein the second feedback voltage is at a second terminal of the resistive storage element and the first current electrode of the first transistor of the second memory cell is coupled to another input of the sense amplifier;
adjusting the sense current through the first memory cell based on the first and second feedback voltages.

14. The method of claim 13 wherein the sense current is adjusted during a read operation.

15. The method of claim 13 further comprising:
applying a source line voltage to the second terminal of the resistive storage element of the first memory cell and to a second terminal of a resistive storage element of the second memory cell.

16. The method of claim 13 further comprising:
during a write operation:
applying a write voltage to the first current electrodes of the first and second transistors in the first memory cell, and
enabling a word line coupled to the first memory cell.

17. The method of claim 13 wherein the sense current is adjusted by
precharging a first capacitor to a reference voltage during a calibration phase; and
coupling a first terminal of the first capacitor to the first current electrode of the second transistor in the first memory cell during a sensing phase, wherein a second terminal of the first capacitor is coupled to a first input of an amplifier.

18. The method of claim 17 further comprising:
precharging a second capacitor to a supply voltage during a calibration phase; and
coupling a first terminal of the second capacitor to the first current electrode of the first transistor in the second memory cell during a sensing phase, wherein a second terminal of the second capacitor is coupled to a second input of the amplifier.

19. The method of claim 13 wherein the first resistive storage element is a non-volatile programmable resistor.

20. An integrated circuit device comprising:
a memory device including:
a first memory cell having a first transistor, a second transistor, and a non-volatile programmable resistor;
a bit line coupled to a first current electrode of the first transistor during a read operation;
a sense amplifier including an input coupled to a first current electrode of the second transistor during the read operation;
a write voltage coupled to the first current electrode of the first and second transistors during a write operation;
a second current electrode of the first and second transistors coupled to a first terminal of the non-volatile programmable resistor;
a source line coupled to a second terminal of the non-volatile programmable resistor;
a word line coupled to a control electrode of the first and second transistors.

* * * * *